(12) United States Patent
Miyagi et al.

(10) Patent No.: US 6,188,293 B1
(45) Date of Patent: Feb. 13, 2001

(54) LOW POWER OSCILLATION CIRCUIT AND NON-VOLATILE SEMICONDUCTOR MEMORY HAVING RING OSCILLATOR

(75) Inventors: Masanori Miyagi; Yoshikazu Kojima, both of Chiba (JP)

(73) Assignee: Seiko Instruments Inc. (JP)

( * ) Notice: Under 35 U.S.C. 154(b), the term of this patent shall be extended for 750 days.

(21) Appl. No.: 08/713,089

(22) Filed: Sep. 16, 1996

Related U.S. Application Data

(63) Continuation of application No. 08/419,355, filed on Apr. 10, 1995.

(30) Foreign Application Priority Data

Apr. 25, 1994 (JP) .................................................... 6-086942
Mar. 10, 1995 (JP) .................................................... 7-051173

(51) Int. Cl.$^7$ ...................................................... H03B 5/24
(52) U.S. Cl. ............................... 331/57; 331/185; 331/186
(58) Field of Search ........................................ 331/185, 186, 331/57

(56) References Cited

U.S. PATENT DOCUMENTS

| | | | | |
|---|---|---|---|---|
| 4,072,910 | * | 2/1978 | Dingwall et al. ...................... | 331/57 |
| 4,473,762 | * | 9/1984 | Iwahashi et al. ..................... | 307/594 |
| 4,618,837 | * | 10/1986 | Matsuura ......................... | 331/186 X |
| 4,710,647 | * | 12/1987 | Young ................................... | 307/297 |
| 4,783,620 | * | 11/1988 | Kitagawa et al. .................... | 323/313 |
| 4,853,654 | * | 8/1989 | Sakurai ................................... | 331/57 |
| 4,912,433 | * | 3/1990 | Motegi et al. ...................... | 331/57 X |
| 5,072,197 | * | 12/1991 | Anderson ............................... | 331/57 |
| 5,365,204 | * | 11/1994 | Angiulli et al. ...................... | 331/57 |
| 5,434,525 | * | 7/1995 | Leonowich .......................... | 331/57 X |
| 5,570,004 | * | 10/1996 | Shibata .................................. | 323/303 |
| 5,594,391 | * | 1/1997 | Yoshizawa ............................. | 331/57 |

* cited by examiner

Primary Examiner—David Mis
(74) Attorney, Agent, or Firm—Adams & Wilks

(57) ABSTRACT

An low-power consumption integrated ring oscillator capable of stable operation throughout a wide voltage range without undergoing a large frequency change includes a first constant voltage generating circuit having an enhancement mode P-MOS transistor and a depletion mode N-MOS transistor and a second constant voltage generating circuit having a depletion mode N-MOS transistor and an enhancement mode N-MOS transistor. A first constant voltage generated by the first constant voltage circuit is applied to a gate electrode of a P-MOS transistor of transmission gates connected between respective cascaded inverters of the ring oscillator. A second constant voltage generated by the second constant voltage generating circuit is connected to the gate electrode of an N-MOS transistor of the transmission gates. By this construction, current consumption is reduced and battery lifetime can be increased. The boosting circuit for writing and erasing an EEPROM circuit may be formed with the low power ring oscillator.

12 Claims, 8 Drawing Sheets

US 6,188,293 B1

LOW POWER OSCILLATION CIRCUIT AND NON-VOLATILE SEMICONDUCTOR MEMORY HAVING RING OSCILLATOR

This is a continuation of application Ser. No. 08/419,355 filed Apr. 10, 1995.

BACKGROUND OF THE INVENTION

The present invention relates a ring oscillation circuit of a MOS-IC which operates by undergoing only a small difference oscillation frequency in response to a wide range of power supply voltage level.

The present invention further relates to a non-volatile semiconductor memory integrated circuit (hereafter: EEPROM-IC) which is able to rewrite electrically, and especially to an EEPROM-IC which operates at a wide power source voltage range from low voltage and low power consumption with one power source. The present invention furthermore relates to electronic memory comprising an EEPROM-IC for storing information and powered by battery like solar battery, and especially to a small size and long life electronic memory. A ring oscillation circuit which in which plural odd invert circuits are connected in a ring configuration therein is used in conventional IC.

An EEPROM -IC with one power source, which generates a voltage several times that of the power source voltage for writing and erasing by driving a booster circuit using a ring oscillator is disclosed in Japan patent H05325578A.

As oscillation frequency of the conventional ring oscillation circuit varies greatly according to a change of input power, the variation being higher than is necessary. Thus current consumption of the circuit becomes large if a stable oscillation frequency at low voltage range is required such that the circuit operates over a wide power source voltage range.

In EEPROM with one power source, a voltage higher voltage than that of the power source is generated by a booster circuit by driving a ring oscillator. When the booster circuit is designed to operate at a low voltage like 1V, there is an increase in power consumption in the circuit at high power source voltage. Consequently, a large size solar battery is needed in an electronic device using an EEPROM-IC powered by solar battery. Electronic devices using a dry battery have a problem in that battery life is short.

The object of the present invention is to achieve stable oscillation by controlling the power source voltage of the oscillation circuit and limiting current.

Another object of the present invention is to provide an EEPROM-IC which does not increase its power consumption in accordance with an increase of power voltage at wide power source voltage range from low voltage to high voltage.

Further object of the present invention is to provide an memory which may be written to and erased using small size solar battery.

SUMMARY OF THE INVENTION

To solve the above problem, a constant voltage generating circuit is arranged and operates a ring oscillating circuit at a constant voltage in the present invention. Further, constant voltage generating circuit and constant current element which is controlled by a constant voltage generated by the constant voltage generating circuit are arranged.

The present invention further includes a non-volatile semiconductor memory comprising a memory cell array having memory an means for memorizing non-volatile memory, oscillating circuit comprising plural odd inverting circuits connected in a ring, booster circuit means for boosting a power source voltage by driving of the oscillating circuit and for generating a high voltage pulse for write/ erasing of the memory means, and a constant current element connected to the inverting circuits.

The present invention furthermore includes a non-volatile semiconductor memory comprising a memory cell array having memory an means for memorizing non-volatile memory, oscillating circuit comprising plural odd inverting circuits connected in a ring, booster circuit means for boosting a power source voltage by driving of the oscillating circuit, and a constant voltage generating circuit for generating a constant voltage which is applied to the oscillating circuit.

Stable oscillation frequency at low voltage range is gained with the above structure. Even at a high voltage, the oscillation frequency does not change greatly and the circuit is able to decrease current consumption.

As current consumption of memory card comprising plural EEPROM-ICs is within half that of the prior art, it is possible to drive the memory card with a solar battery.

DETAILED DESCRIPTION OF THE REFERRED EMBODIMENTS

Figure 1:
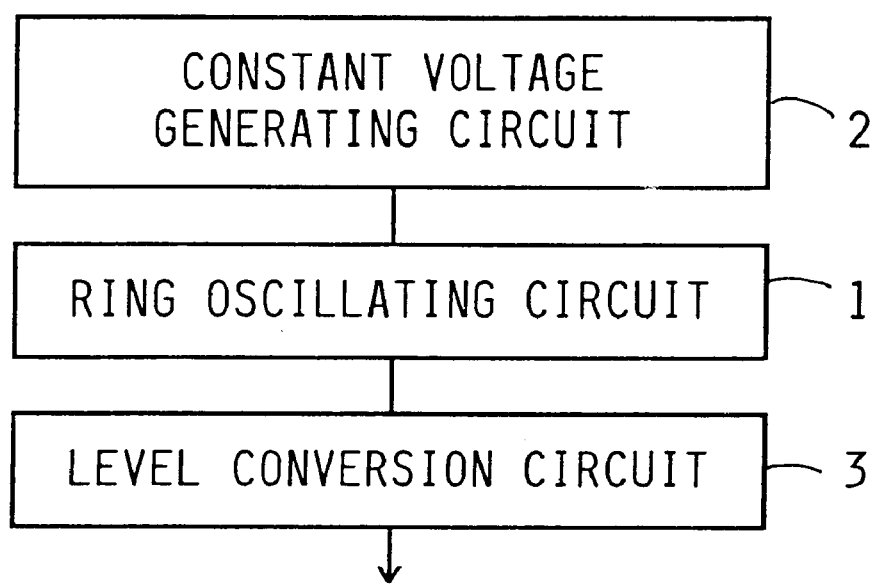
FIG. 1 shows a block diagram of first embodiment according to the present invention.
Figure 2:
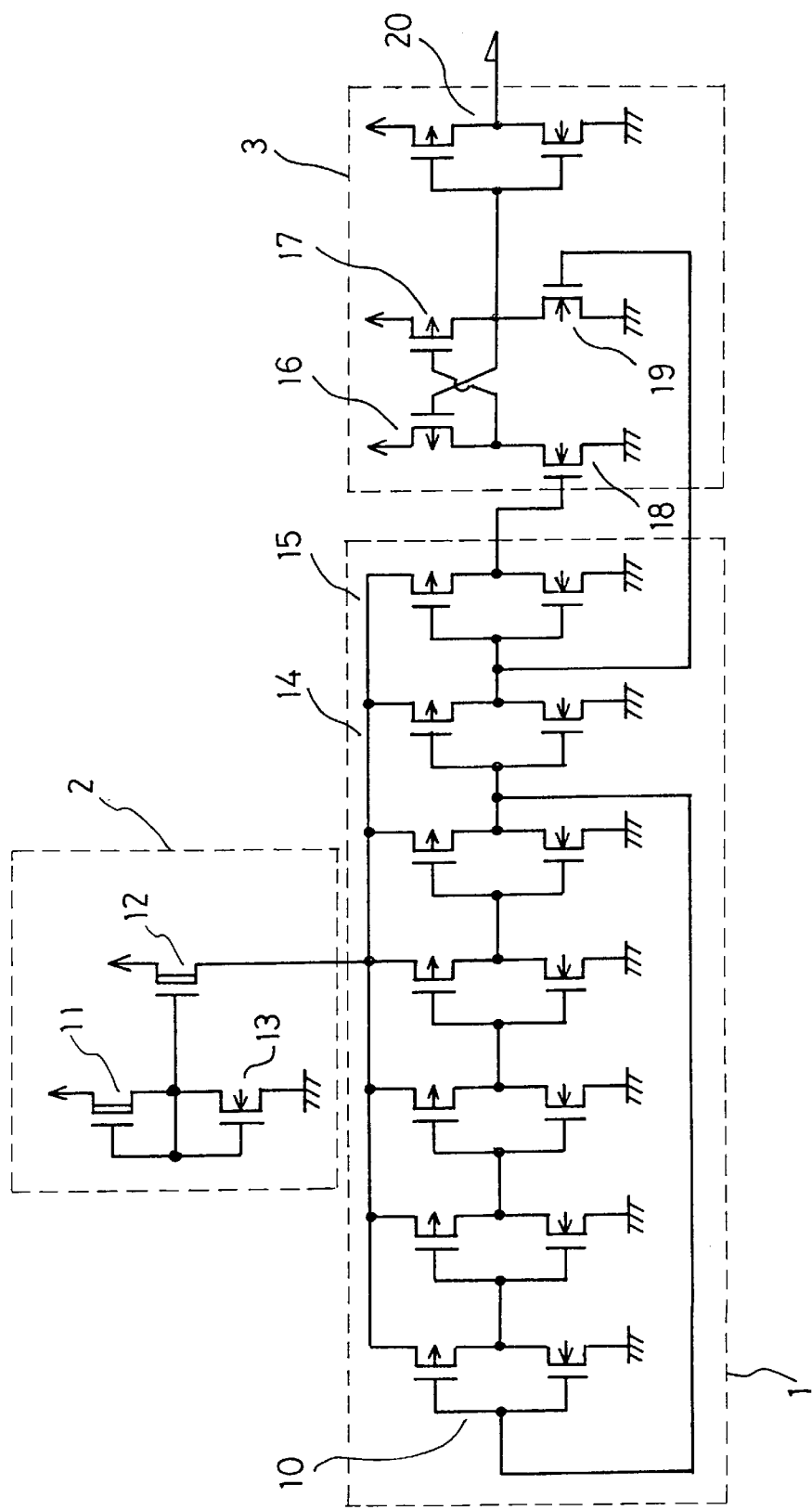
FIG. 2 shows a circuit diagram of first embodiment according to the present invention.

Referring to the drawings, embodiments of the present invention are described. FIG. 1 shows a block diagram of first embodiment according to the present invention. Power source of a ring oscillation circuit 1 is connected to a constant voltage generating circuit 2 and the output of the ring oscillation circuit 1 is connected to a level conversion circuit 3. FIG. 2 shows a detailed circuit diagram of the first embodiment according to the present invention. The ring oscillation circuit 1 comprising five invert circuits 10 oscillates under constant voltage generated by constant voltage generating circuit 2 comprising depletion mode N-MOS transistors 11 and 12, and enhancement mode N-MOS transistor 13. Output signal of ring oscillation circuit 1 undergoes waveform shaping by invert circuits 14 and 15, operating under the same constant voltage. After that, it is inputted to the level conversion circuit 3 comprising enhancement mode P-MOS transistors 16 and 17, and enhancement mode N-MOS transistors 18 and 19. Finally it becomes a signal which is as same as power source voltage at its amplitude. As the ring oscillation circuit of FIG. 2 always operates under the constant voltage, oscillation frequency is constant independently of power source voltage.

Figure 3:
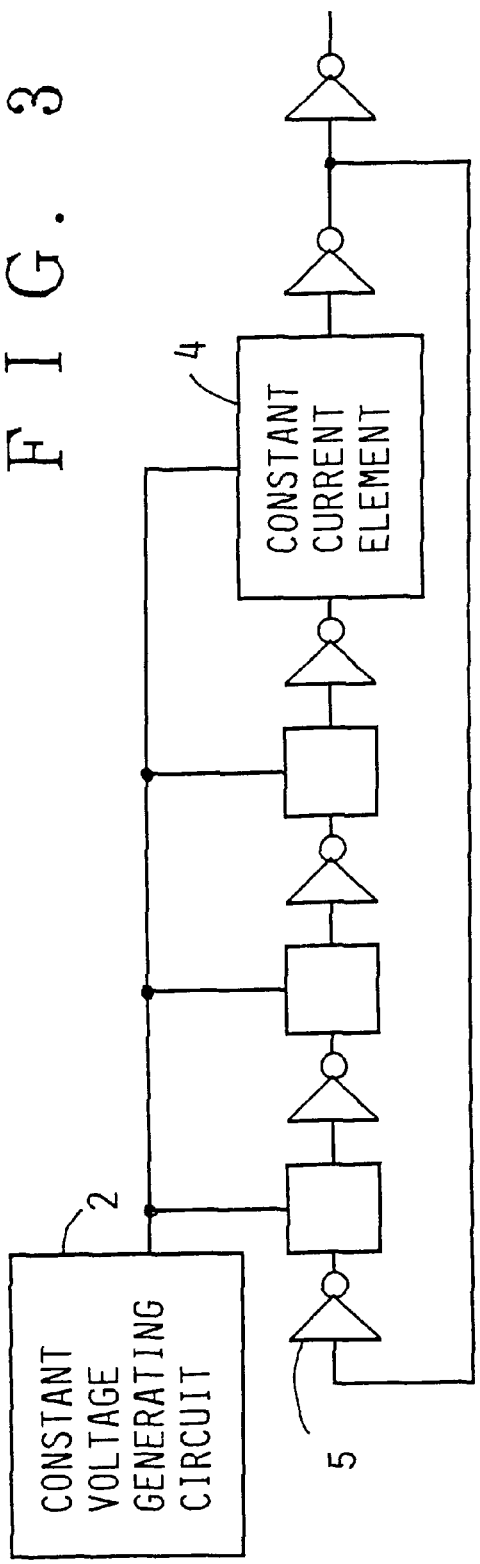
FIG. 3 shows a block diagram of second embodiment according to the present invention.
Figure 4:
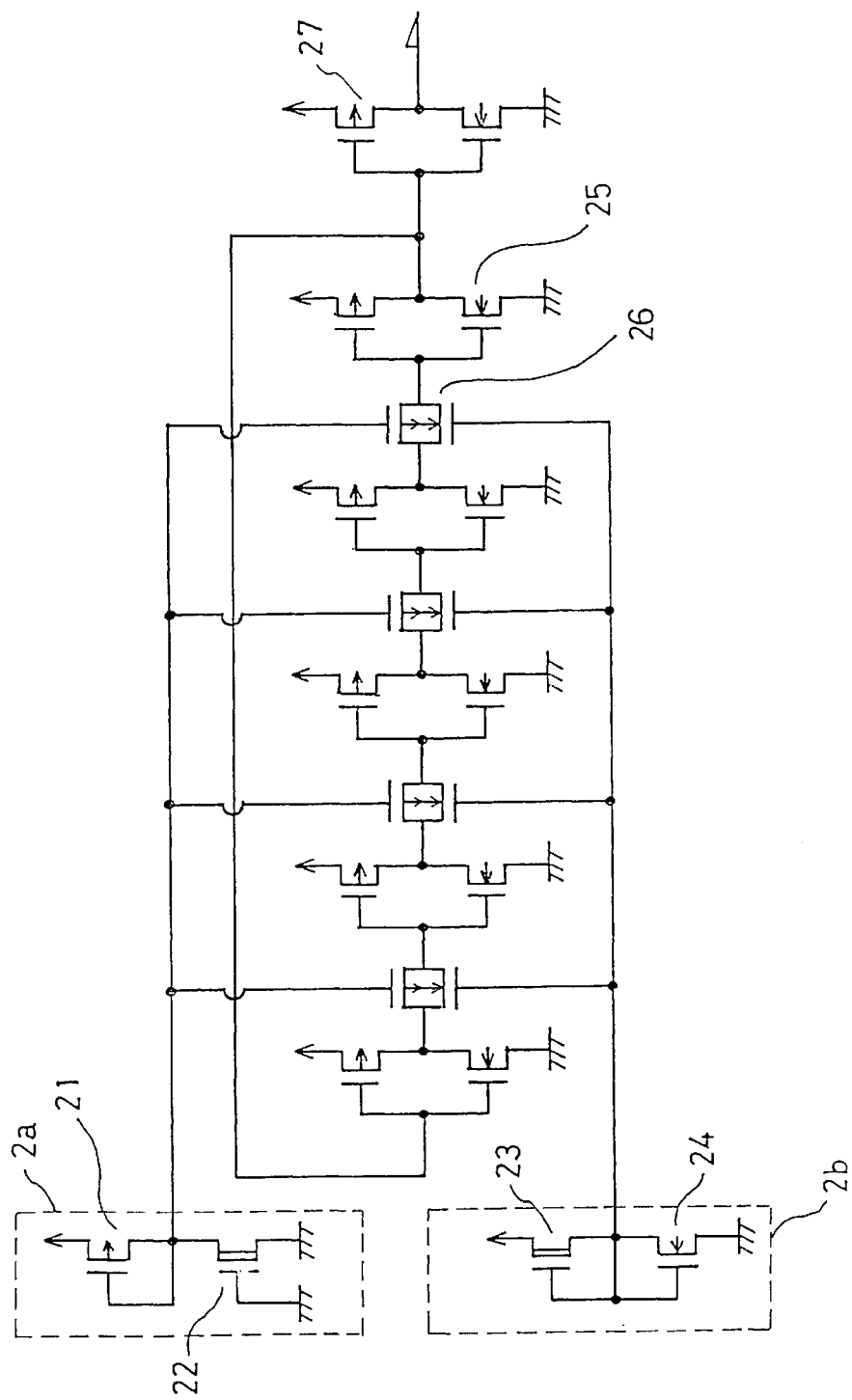
FIG. 4 shows a circuit diagram of second embodiment according to the present invention.

FIG. 3 shows a block diagram of second embodiment according to the present invention. Constant current elements 4 are connected between invert circuit 5 connected to the constant voltage generation circuit 2. FIG. 4 shows a detailed circuit diagram of second embodiment according to the present invention. A first constant voltage generating circuit 2a comprising enhancement mode P-MOS transistor 21 and depletion mode NMOS transistor 22 generates a first constant voltage. A second constant voltage generating circuit 2b comprising depletion mode N-MOS transistor 23 and enhancement mode N-MOS transistor 24 generates a second constant voltage. Transmission gates 26 are inserted between each invert circuit 25. The first constant voltage is applied to the gate of each P-MOS transistor of the transmission gate, and the second constant voltage is applied to the gate of the N-MOS transistor thereof. Consequently, each transmission gate 26 operates as a kind of constant current element. In FIG. 4 electric charge Q charge/discharged to gate electrode capacity of invert circuit 25 is given in the formula;

$$Q = Cg \times E \qquad \text{formula 1}$$

$$Q = Itg \times dt \qquad \text{formula 2}$$

$$= Itg \times t \qquad \text{formula 2'}$$

Wherein Cg: gate electrode capacity of the inverter,

E: power source voltage,

Itg: current to the transmission gate, and t: charge/discharging time.

Formula 2 shows that Itg is a function of charge/discharging time t. As it is considered that Itg is constant independently of time under the power source voltage range in which constant voltage generating circuit 2 of FIG. 4 operates stably, formula 2 is same as formula 2'. Consequently, charge/discharging time t is given by formulas 1 and 2';

$$t = (Cg / Itg) \times E \qquad \text{formula 3}$$

As it is considered that Cg and Itg are constant, charge/discharging time t is proportional to power source voltage E and oscillation frequency is inverse proportional to power source voltage E as shown in formula 4 below.

$$f = 1/2t \qquad \text{formula 4}$$

$$= (1/2) \times (Itg / Cg) \times (1/E)$$

Figure 5:
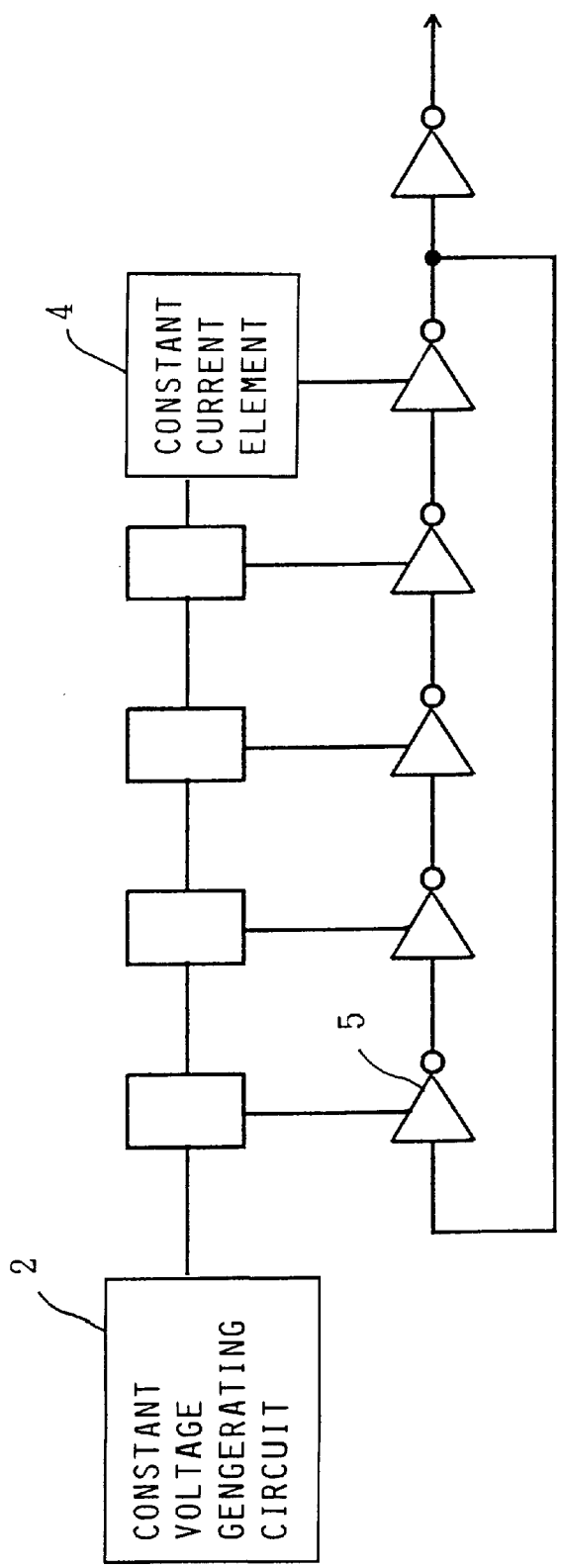
FIG. 5 shows a block diagram of third embodiment according to the present invention.
Figure 6:
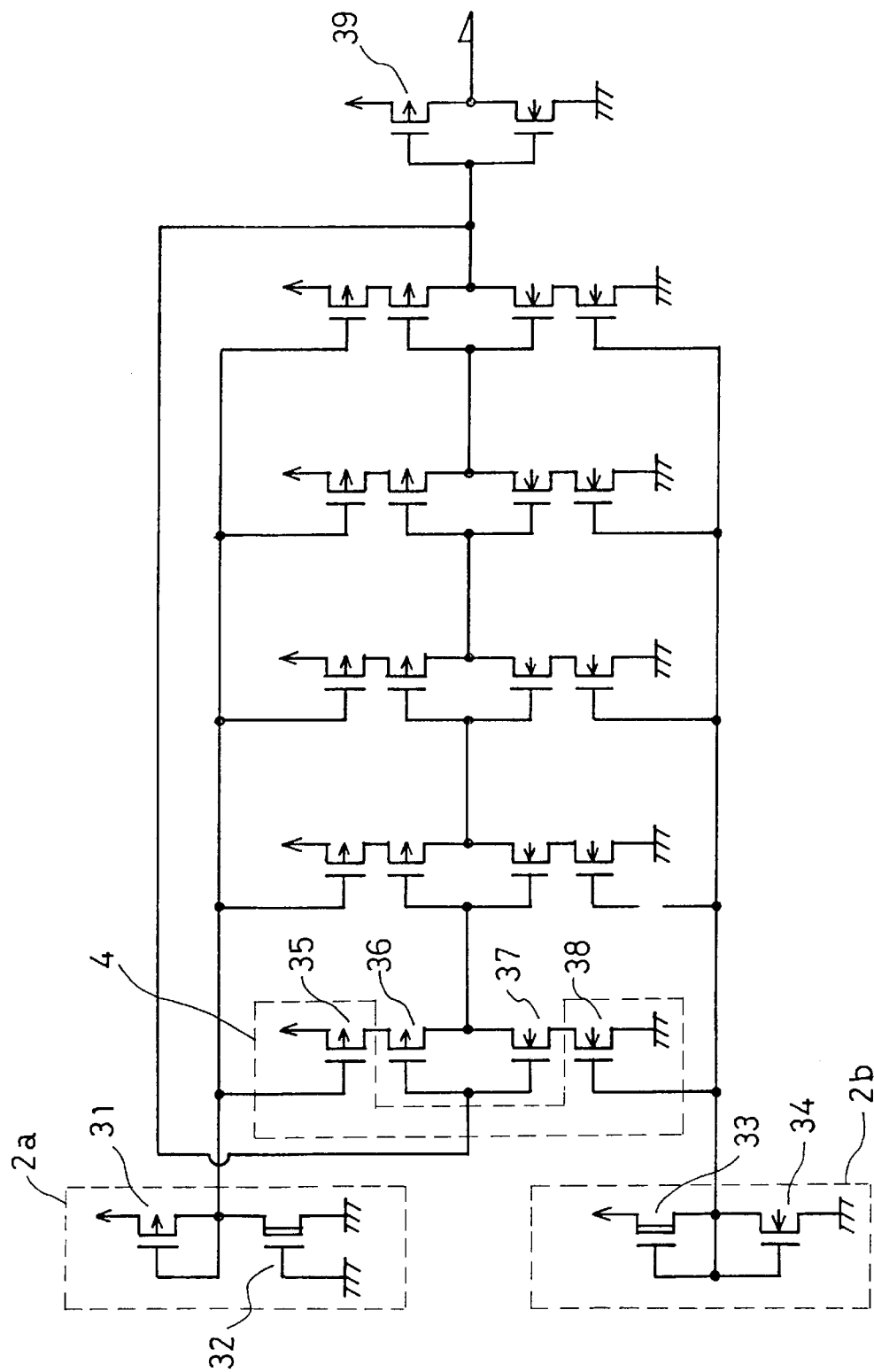
FIG. 6 shows a circuit diagram of third embodiment according to the present invention.

FIG. 5 is a block diagram of a third embodiment according to the present invention. Constant current elements 4 are connected to a respective invert circuit 5 and constant voltage generating circuit 2. FIG. 6 is a detailed circuit diagram of third embodiment according to the present invention. First constant voltage generating circuit 2a comprising enhancement mode P-MOS transistor 31 and depletion mode N-MOS transistor 32 generates first constant voltage. A second constant voltage generating circuit comprising depletion mode N-MOS transistor 33 and enhancement mode N-MOS transistor 34. It is similar to the embodiment of FIG. 4.

Enhancement mode P-MOS transistors 35 are connected to enhancement mode P-MOS transistors 36 of invert circuit in series and enhancement mode N-MOS transistors 38 are connected to enhancement mode N-MOS transistors 37 of invert circuit. The first constant voltage is applied to gate electrodes of the enhancement mode P-MOS transistors 35 and the second constant voltage is applied to gate electrodes of the enhancement mode N-MOS transistors 38. Gate electrodes of enhancement mode P-MOS transistors 36 are connected to gate electrodes of enhancement NMOS transistors 37 and the connection point therebetween is connected to the output of the preceding invert circuit. Both enhancement mode P-MOS transistors 35 which the first constant voltage applies to and enhancement mode N-MOS transistors 38 which the second constant voltage apples to operate as a kind of constant current element like the transmission gate of the embodiment of FIG. 4.

Consequently, oscillating frequency of the embodiment of FIG. 6 is inversely proportional to power source voltage similarly to the embodiment of FIG. 4.

Figure 7:
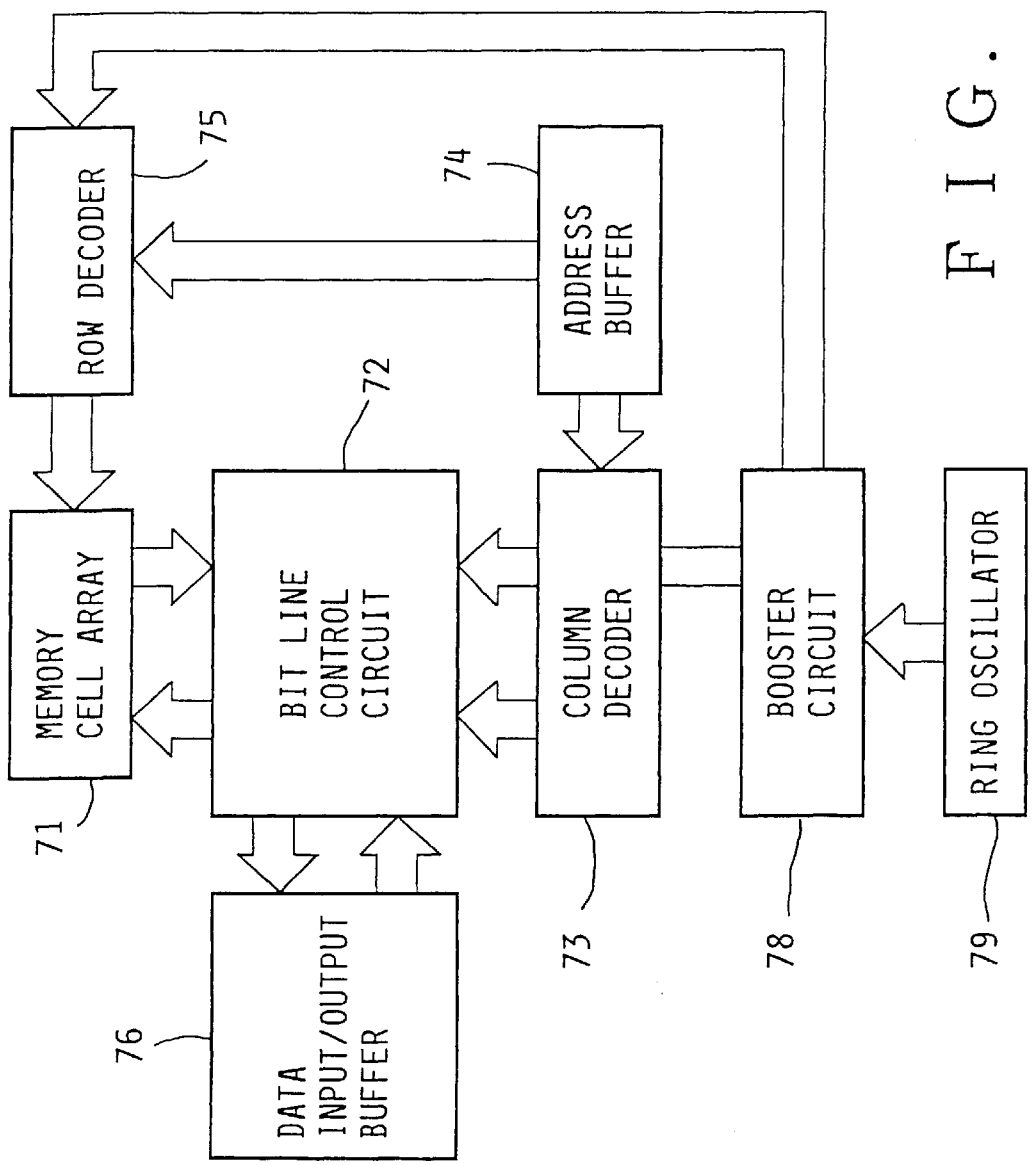
FIG. 7 shows a block diagram of EEPROM-IC according to the present invention.

FIG. 7 shows a block diagram of an EEPROM-IC according to the present invention. Bit line control circuit 72 is arranged, which writes and reads data to memory cell array 71 as memory means.

The bit line control circuit 72 is connected to data input/output buffer 76 and to be output of column decoder 73 receiving address signal from address buffer 74. Further, row decoder 75 is connected to the memory cell array 71 for controlling the control gate of memory cells and select gate. Memory IC comprises circuit ruling each function of the memory cell array.

Booster circuit 78 boosts the power source voltage using a drive signal from the ring oscillator 79 and applies the boosted voltage to the bit line control circuit 72 and the row decoder 75 when the memory cell array 71 is to be written/erased.

Figure 8:
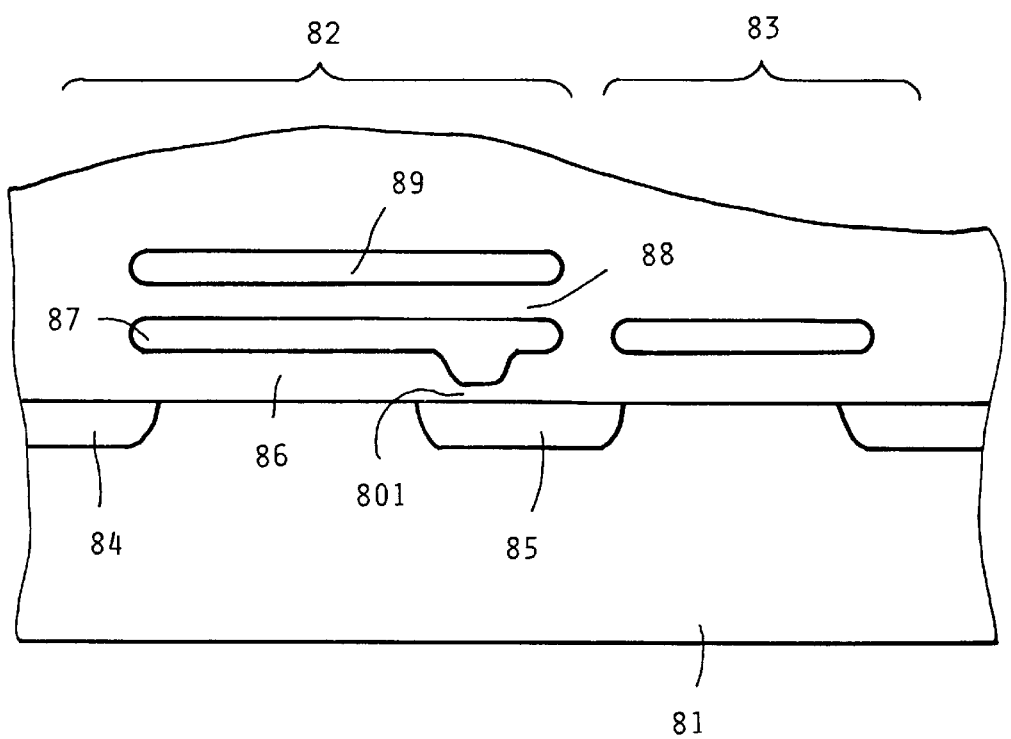
FIG. 8 shows a sectional view of EEPROM memory cell.

FIG. 8 shows a sectional view of the EEPROM memory cell. Floating gate transistor 82 and gate select transistor 83 are connected in series electrically on P-silicon substrate 81. In the floating gate transistor 82, floating gate electrode 87, control gate insulation layer 88 and control gate 89 are arranged through gate insulation layer 86 on a channel area between N-source area 84 and drain area 85. Drain area 85 and floating gate electrode 87 are formed one upon another through tunnel insulation layer 801, the thickness of which is 70 to 100 Å.

Tunnel current flows to tunnel insulation layer, changes electronic quantity and make program when high voltage is applied between the control gate electrode 89 drain area 85. A non-volatile data is programmed as channel conductance of floating gate transistor changes according to electronic quantity of the floating gate electrode 87.

In general, insulation destruction occurs easily when high electric field is applied rapidly to tunnel insulation layer 801. Therefore, applying high voltage is pulse, raising time of which is several tens of $\mu$ sec to several hundred $\mu$ sec when program is made to the control gate electrode or drain area. Special charging capacitor for controlling raising time is not needed by decreasing its current value because oscillation circuit of the present invention controls current flowing in each invert circuit comprising ring oscillator. It means that only the capacitance of gate electrode of transistor in invert circuit can function as a charging capacitor like the circuit of FIGS. 4 and 6. consequently, special capacitor of circuit for control ramp of program pulse is not needed and IC of which is able to be miniaturized.

EEPROM-IC which operates with one power source wide power source voltage range like 0.7 to 6 V is realized with simple circuit when oscillating circuit of the present invention applies to EEPROM-IC. Further, power at operation is able to be within half that of the prior art.

Power consumption is the most at programming when high voltage used in EEPROM. Consequently, current consumption at program in EEPROM-IC of the present invention is able to be lower than half that of the prior art.

Above mentioned EEPROM-IC is suitable to memory of battery operation and small size electronic device of battery operation. EEPROM-IC is suitable to portable communication device having solar battery.

The present invention is able to achieve stable oscillation frequency at the low voltage of power source, to depress rise of oscillation frequency at the high voltage of power source, and to depress current consumption by means of arranging constant voltage generating circuit in the ring oscillating circuit or arranging constant voltage generating circuit and constant current element controlled by constant voltage generated by the constant voltage generating circuit.

As described above, the present invention is able to get EEPROM-IC operating at wide power source voltage like 0.7 to 6 V and within half the power consumption of the prior art. Further, the present invention is able to realize small size and long life electronic device comprising EEPROM and operating with battery

What is claimed is:

1. A ring oscillator circuit comprising: an odd number of inverter circuits connected in a ring configuration; a constant current element connected in series between an output of a respective inverter circuit and an input of the next inverter circuit; and a constant voltage circuit comprising MOS transistors for receiving an external power source voltage and applying a constant voltage to said constant current elements.

2. A ring oscillator circuit according to claim 1; wherein the respective constant current elements each comprise a transmission gate and the constant voltage circuit comprises a pair of constant voltage circuits each connected to the constant current element.

3. A ring oscillator circuit comprising: an odd number of series-connected inverter circuits connected in a ring configuration; a constant current element connected between two of the series-connected inverter circuits; and a constant voltage supply connected to the constant current element, the constant voltage supply comprising a plurality of MOS transistors, an input terminal for receiving an external power supply voltage, and an output terminal for outputting a constant voltage signal.

4. A ring oscillator circuit according to claim 3; wherein the constant current element comprises a MOS transfer gate having an input terminal connected to an output of a respective inverter circuit and an output terminal connected to an input of the next consecutive inverter circuit.

5. A ring oscillator circuit according to claim 3; wherein the respective inverter circuits comprise first and second MOS transistors having interconnected gate electrodes, a drain electrode of the first MOS transistor being connected to a source electrode of the second MOS transistor.

6. A ring oscillator circuit according to claim 3; wherein the constant voltage supply comprises first and second constant voltage circuits, each constant voltage circuit comprising a plurality of MOS transistors, an input terminal for receiving the external power supply voltage, and an output terminal for outputting the constant voltage signal, the output terminal of the first constant voltage circuit being connected to a first gate electrode of the constant current element, and the output terminal of the second constant voltage circuit being connected to a second gate electrode of the constant current element.

7. A ring oscillator circuit comprising: an odd number of series-connected inverter circuits connected in a ring configuration such that an input of a first inverter circuit is connected to an output of a last inverter circuit; a constant current element connected between the series-connected inverter circuits; and a constant voltage supply connected to each of the constant current elements for supplying a constant voltage signal thereto, such that the frequency of a signal output by the ring oscillator is inversely proportional to the level of the constant voltage signal, the constant voltage supply comprising a plurality of MOS transistors, an input terminal for receiving an external power supply voltage, and an output terminal for outputting the constant voltage signal.

8. A ring oscillator circuit according to claim 7; wherein the constant current elements each comprise a MOS transfer gate having an input terminal connected to an output of a respective inverter circuit and an output terminal connected to an input of the next consecutive inverter circuit.

9. A ring oscillator circuit according to claim 7; wherein the respective inverter circuits comprise first and second MOS transistors having interconnected gate electrodes, a drain electrode of the first MOS transistor being connected to a source electrode of the second MOS transistor.

10. A ring oscillator circuit according to claim 7; wherein the constant voltage supply comprises first and second constant voltage circuits, each of the constant voltage circuits comprising a plurality of MOS transistors, an input terminal for receiving the external power supply voltage, and an output terminal for outputting the constant voltage signal, the output terminal of the first constant voltage circuit being connected to a first gate electrode of the constant current element, and the output terminal of the second constant voltage circuit being connected to a second gate terminal of the constant current element.

11. A ring oscillator circuit comprising: an odd number of series-connected inverter circuits connected in a ring configuration wherein an input terminal of a first inverter circuit is connected to an output terminal of a last inverter circuit, the inverter circuits each comprising first and second MOS transistors having interconnected gate electrodes, a source terminal of the first MOS transistor being connected to a drain terminal of the second MOS transistor; a third MOS transistor connected between an external power source and a drain terminal of the respective first transistors of the inverter circuits and a fourth MOS transistor connected between a source terminal of the second transistor of the inverter circuits and ground, the third and fourth MOS transistors being effective for maintaining the current of the inverter circuits constant, the third and fourth MOS transistors having the same channel conductivity type as the first and second MOS transistors, respectively; and a constant voltage source having an output terminal for supplying a constant voltage connected to gate electrodes of the third and fourth MOS transistors, respectively; wherein the constant voltage source comprises a first constant voltage circuit comprising a pair of MOS transistors, an input terminal for receiving an external power source voltage and an output terminal for supplying a first constant voltage signal, the output terminal being connected to the gate electrode of the third MOS transistor, and a second constant voltage circuit comprising a pair of MOS transistors, an input terminal for receiving an external power source voltage and an output terminal for supplying a second constant voltage signal, the output terminal of the second constant voltage circuit being connected to the gate electrode of the fourth MOS transistor.

12. In a non-volatile memory device having a plurality of memory cells arranged in a matrix for storing data and a boosting circuit for boosting a power supply voltage to generate a high voltage pulse for writing to or erasing respective memory cells, the oscillator circuit according to claim 3; wherein the constant voltage circuit comprises a plurality of MOS transistors, an input terminal for receiving the power supply voltage, and an output terminal for outputting a constant voltage signal, and wherein an output terminal of the ring oscillator is connected to a level converting circuit.

* * * * *